United States Patent
Hill

(10) Patent No.: US 8,282,846 B2
(45) Date of Patent: Oct. 9, 2012

(54) METAL INTERCONNECT STRUCTURE WITH A SIDE WALL SPACER THAT PROTECTS AN ARC LAYER AND A BOND PAD FROM CORROSION AND METHOD OF FORMING THE METAL INTERCONNECT STRUCTURE

(75) Inventor: Rodney L. Hill, Buxton, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 338 days.

(21) Appl. No.: 12/714,450

(22) Filed: Feb. 27, 2010

(65) Prior Publication Data
US 2011/0209899 A1  Sep. 1, 2011

(51) Int. Cl.
C23F 1/00 (2006.01)
B44C 1/22 (2006.01)
H01B 13/00 (2006.01)
H01B 5/00 (2006.01)

(52) U.S. Cl. ........... 216/46; 216/12; 216/18; 216/39; 174/126.1

(58) Field of Classification Search .......... 174/126.1; 257/774, 751; 438/601, 687; 29/829; 216/12, 216/18, 39, 46
See application file for complete search history.

(56) References Cited

U.S. PATENT DOCUMENTS

| | | | |
|---|---|---|---|
| 4,838,991 A * | 6/1989 | Cote et al. ............... 216/46 |
| 5,266,446 A * | 11/1993 | Chang et al. ............. 430/314 |
| 5,294,295 A * | 3/1994 | Gabriel .................... 438/696 |
| 5,444,012 A | 8/1995 | Yoshizumi et al. |
| 5,563,762 A | 10/1996 | Leung et al. |
| 5,756,396 A * | 5/1998 | Lee et al. ................. 438/622 |
| 5,798,568 A | 8/1998 | Abercrombie et al. |
| 5,814,563 A | 9/1998 | Ding et al. |
| 6,121,098 A * | 9/2000 | Strobl ..................... 438/301 |
| 6,140,702 A | 10/2000 | Efland et al. |
| 6,323,131 B1 * | 11/2001 | Obeng et al. ............. 438/687 |
| 6,376,353 B1 * | 4/2002 | Zhou et al. ............... 438/612 |
| 6,399,512 B1 * | 6/2002 | Blosse et al. ............. 438/723 |
| 6,424,037 B1 * | 7/2002 | Ho et al. .................. 257/738 |
| 6,569,767 B1 * | 5/2003 | Fujisawa et al. .......... 438/687 |
| 6,613,671 B1 * | 9/2003 | Chopra et al. ............ 438/687 |
| 6,677,226 B1 | 1/2004 | Bowen et al. |
| 6,677,228 B1 * | 1/2004 | Su et al. ................... 438/612 |
| 6,750,129 B2 | 6/2004 | Yang et al. |
| 6,866,943 B2 | 3/2005 | Friese et al. |
| 6,888,251 B2 * | 5/2005 | Cooney et al. ........... 257/774 |
| 2007/0238304 A1 | 10/2007 | Wu |
| 2009/0166800 A1 * | 7/2009 | Richter et al. ............ 257/506 |

OTHER PUBLICATIONS

U.S. Appl. No. 11/514,621, filed Sep. 1, 2006 to Rodney Hill.
Thomas J. Barbieri et al., "Vanishing TiN ARC Coating as an Indicator of EOS in Aluminum Top Metal Lines", Proceedings of the 32nd International Symposium for Testing and Failure Analysis, Nov. 12-16, 2006, pp. 461-468.

* cited by examiner

Primary Examiner — Timothy Thompson
Assistant Examiner — Sherman Ng
(74) Attorney, Agent, or Firm — Eugene C. Conser; Wade J. Brady, III; Frederick J. Telecky, Jr.

(57) ABSTRACT

A metal interconnect structure, which includes a bond pad, an overlying anti-reflective coating layer, an overlying passivation layer, and an opening that exposes a top surface of the bond pad, eliminates corrosion resulting from the anti-reflective layer being exposed to moisture during reliability testing by utilizing a side wall spacer in the opening that touches the side wall of the passivation layer, the side wall of the anti-reflective coating layer, and the top surface of the bond pad.

20 Claims, 4 Drawing Sheets

METAL INTERCONNECT STRUCTURE WITH A SIDE WALL SPACER THAT PROTECTS AN ARC LAYER AND A BOND PAD FROM CORROSION AND METHOD OF FORMING THE METAL INTERCONNECT STRUCTURE

BACKGROUND OF THE INVENTION

1. Field of the Invention

The present invention relates to metal interconnect structures and, more particularly, to a metal interconnect structure with a side wall spacer that protects an anti-reflective coating (ARC) layer and a bond pad from corrosion.

2. Description of the Related Art

One of the final processing steps in the fabrication of an integrated circuit is the formation of bond pads, which are commonly formed around the periphery of the top surface of the integrated circuit. Bond pads, which are part of the metal interconnect structure, provide a location to which external electrical connections are made to the integrated circuit.

FIG. 1 shows a cross-sectional view that illustrates a portion of a conventional metal interconnect structure 100. As shown in FIG. 1, the metal interconnect structure 100 includes a non-conductive layer 110, a conductive via 112 that extends through the non-conductive layer 110, and a conductive bond pad 114 that touches the top surface of the non-conductive layer 110 and the conductive via 112. The bond pad 114 is commonly implemented with aluminum, aluminum silicon, aluminum copper, or aluminum silicon copper.

As further shown in FIG. 1, the metal interconnect structure 100 also includes an anti-reflective coating (ARC) layer 116 that touches the top surface of the bond pad 114, and a passivation layer 118 that touches the top surface of the non-conductive layer 110 and the top surface of the ARC layer 116. The ARC layer 116 is commonly implemented with titanium (Ti), titanium nitride (TiN), titanium tungsten (TiW), or tantalum nitride (TaN), while the passivation layer 118 is commonly implemented with an oxide layer 118A and an overlying nitride layer 118B.

In addition, an opening 120 in the passivation layer 118 and the ARC layer 116 exposes the top surface of the bond pad 114. The bond pad 114, which is electrically connected to transistors and other devices that make up the integrated circuit, is electrically connected to the outside world by way of a bonding wire or a solder ball.

After the fabrication of the integrated circuit has been completed, the integrated circuit is subjected to reliability testing under high humidity, high temperature, and high voltage bias conditions. One of the problems encountered during the reliability testing is that moisture can react with the titanium (Ti), titanium nitride (TiN), titanium tungsten (TiW), or tantalum nitride (TaN) of the ARC layer 116 that is exposed by the opening 120.

This reaction, in turn, forms a corrosive by-product that can oxidize the bond pad 114, thereby significantly increasing the resistance of the bond pad 114, or electrically isolating the bond pad 114 from the conductive via 112. The corrosive by-product can also form cracks in the passivation layer 118, and electrically short the bond pad 114 to other conductive structures.

Thus, there is a need for a method of testing integrated circuits under high humidity, high temperature, and high voltage bias conditions that does not lead to the formation of a corrosive by-product.

DETAILED DESCRIPTION OF THE INVENTION

Figure 1:
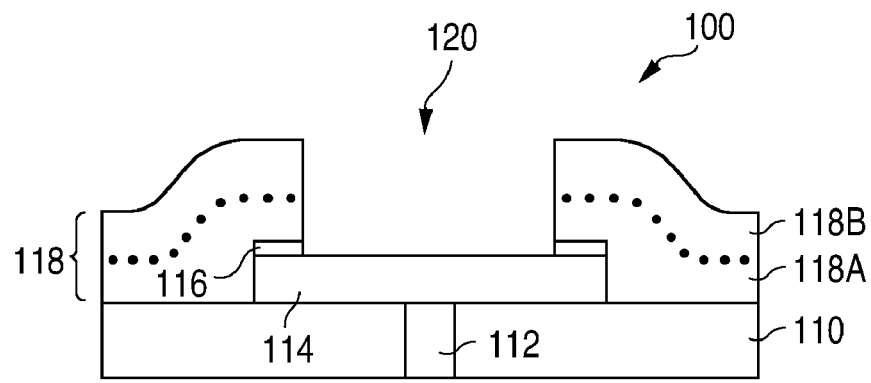
FIG. 1 is a cross-sectional view illustrating a portion of a conventional metal interconnect structure 100.
Figure 2:
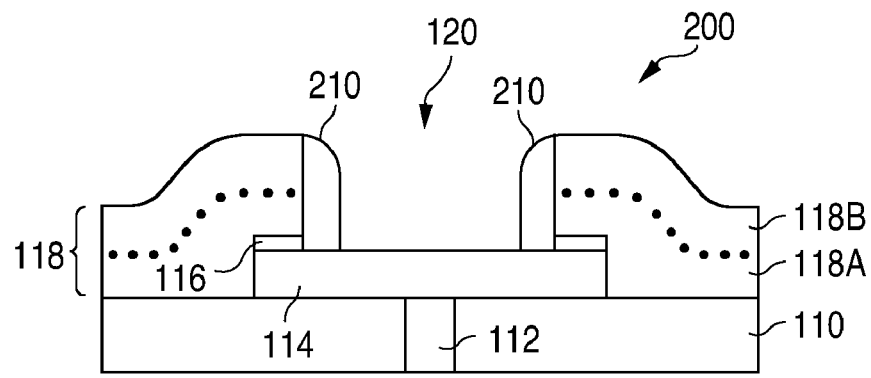
FIG. 2 is a cross-sectional view illustrating an example of a metal interconnect structure 200 in accordance with the present invention.

FIG. 2 shows a cross-sectional view that illustrates an example of a metal interconnect structure 200 in accordance with the present invention. As described in greater detail below, the present invention utilizes a side wall spacer to cover the portion of the ARC layer that is exposed by the opening which exposes the top surface of the bond pad. This, in turn, protects the ARC layer from exposure to moisture during reliability testing as well as during the end use application.

Metal interconnect structure 200 is similar to metal interconnect structure 100 and, as a result, utilizes the same reference numerals to designate the elements which are common to both metal interconnect structures. As shown in FIG. 2, metal interconnect structure 200 differs from metal interconnect structure 100 in that metal interconnect structure 200 includes a side wall spacer 210 that lies in the opening 120.

As further shown in FIG. 2, the side wall spacer 210 touches the top surface of the bond pad 114, and the side wall surfaces of the ARC layer 116 and the passivation layer 118 which are exposed by opening 120. In the present example, the side wall spacer 210 is non-conductive, and can be implemented with, for example, nitride, oxynitride, or oxide.

Since the side wall spacer 210 touches the exposed side wall surface of the ARC layer 116, the side wall spacer 210 protects the exposed side wall of the ARC layer 116 from moisture and, as a result, protects the ARC layer 116 and the bond pad 114 from moisture and corrosion during reliability testing as well as during the end use application.

Figure 3:
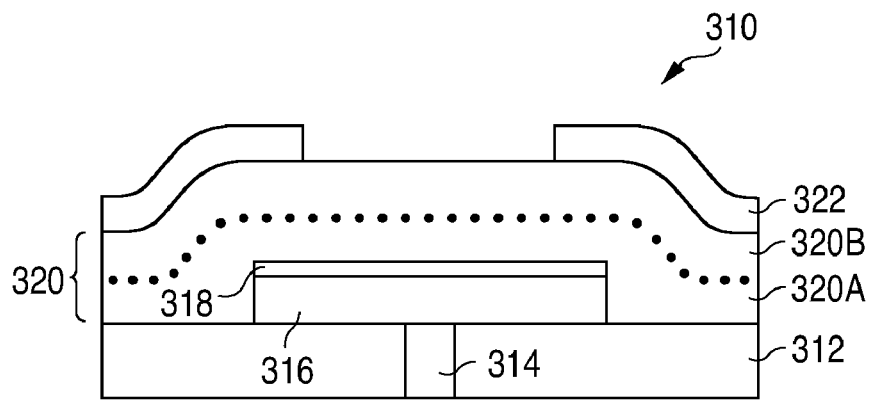
FIGS. 3-11 are a series of cross-sectional views illustrating an example of a method of forming a connected metal interconnect structure 300 in accordance with the present invention.

FIGS. 3-11 show a series of cross-sectional views that illustrate an example of a method of forming a connected metal interconnect structure 300 in accordance with the present invention. As shown in FIG. 3, the method of the present invention utilizes a conventionally formed metal interconnect structure 310 that includes a non-conductive layer 312, and a conductive via 314 that extends through the non-conductive layer 312.

The metal interconnect structure 310 also includes a conductive bond pad 316 that touches the top surface of the non-conductive layer 312 and the conductive via 314, and an anti-reflective coating (ARC) layer 318 that touches the top surface of bond pad 316. The bond pad 316 can be implemented with, for example, aluminum, aluminum silicon, aluminum copper, or aluminum silicon copper. The ARC layer 318, in turn, can be implemented with, for example, titanium (Ti), titanium nitride (TiN), titanium tungsten (TiW), or tantalum nitride (TaN).

As further shown in FIG. 3, the method begins by forming a passivation layer 320 on the metal interconnect structure 310 in a conventional manner to touch the top surface of the non-conductive layer 312 and the top surface of the ARC layer 318. Passivation layer 320 can be formed by, for example, forming an oxide layer 320A that touches the top surface of the non-conductive layer 312 and the top surface of the ARC layer 318, followed by the formation of a nitride layer 320B that touches the top surface of the oxide layer 320A. In addition, other materials, such as phosphorus silicon glass (PSG), boron phosphorous silicon glass (BPSG), or tetra-ethyl-ortho-silicate (TEOS) are commonly used as passivation layers.

After the passivation layer 320 has been formed on the non-conductive layer 312 and the ARC layer 318, a mask 322 is formed and patterned in a conventional manner on the top surface of the passivation layer 320. The mask 322 can be implemented with, for example, a layer of photoresist.

Figure 4:
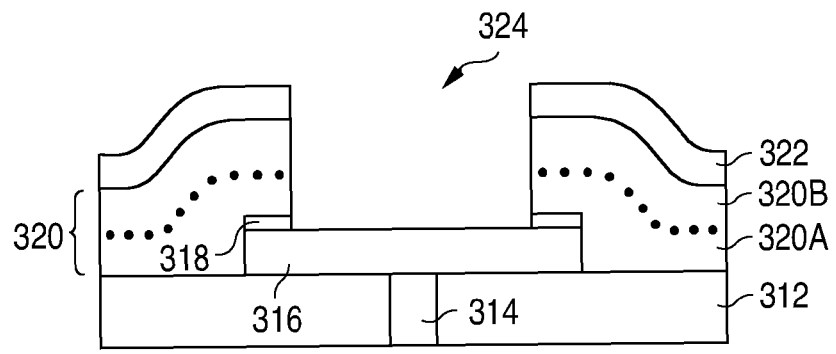

As shown in FIG. 4, once the mask 322 has been formed and patterned, the regions exposed by the mask 322 are conventionally etched to form an opening 324 that exposes the top surface of the bond pad 316. As additionally shown in FIG. 4, the opening 324 also exposes a side wall of the passivation layer 320 and a side wall of the ARC layer 318. The mask 322 is then removed.

Figure 5:
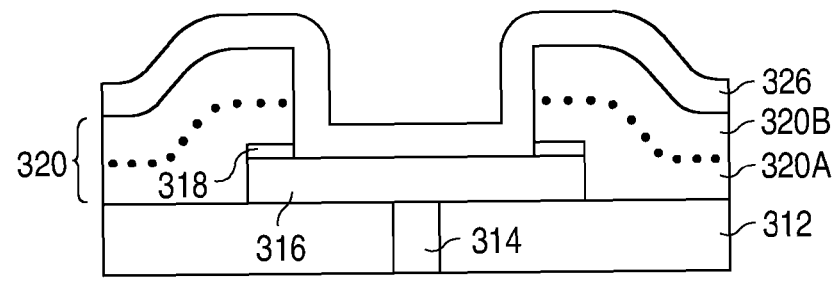

As shown in FIG. 5, in accordance with the present invention, following the removal of the mask 322, a protective layer 326 is conformally formed to touch the top surface of the passivation layer 320 and line the opening 324 to touch the side wall of the passivation layer 320, the side wall of the ARC layer 318, and the top surface of the bond pad 316. Protective layer 326 can be implemented with, for example, nitride, oxynitride, or oxide.

Figure 6:
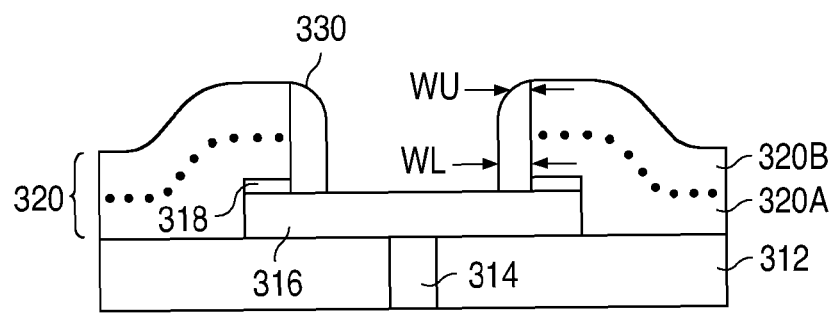

Next, as shown in FIG. 6, once the protective layer 326 has been formed, the protective layer 326 is anisotropically etched until the center region of the bond pad 316 is exposed. As further shown in FIG. 6, the anisotropic etch of the protective layer 326 forms a side wall spacer 330 that covers and protects the exposed side wall of the ARC layer 318. As a result of the anisotropic etch, the side wall spacer 330 has a lower width WL that is substantially larger than an upper width WU.

Figure 7:
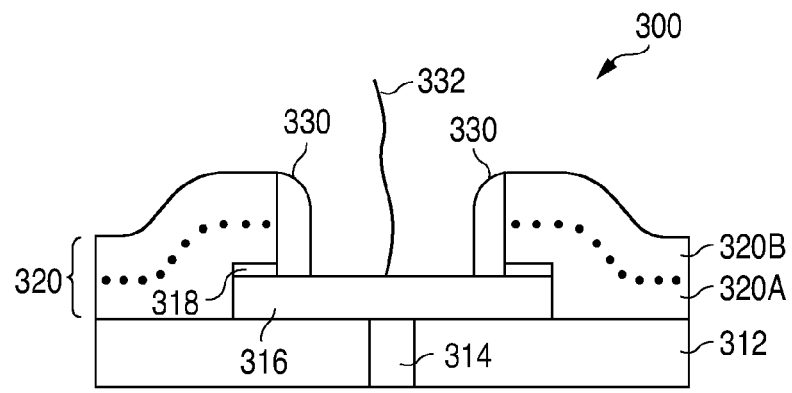
Figure 8:
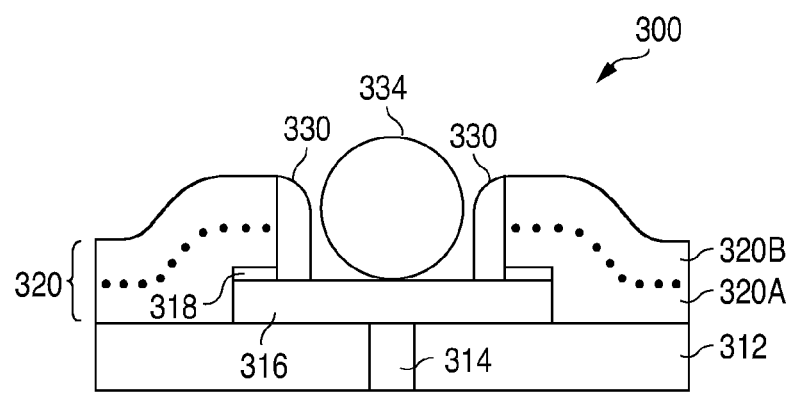

As shown in FIG. 7, after the side wall spacer 330 has been formed, the method completes the formation of the connected metal interconnect structure 300 by attaching a bonding wire 332 to the bond pad 316 in a conventional manner to make an electrical connection to a package or, alternately, as shown in FIG. 8, the method completes the formation of the connected metal interconnect structure 300 by attaching a solder ball 334 to the bond pad 316 in a conventional manner to make an electrical connection to, for example, a printed circuit board.

Figure 9:
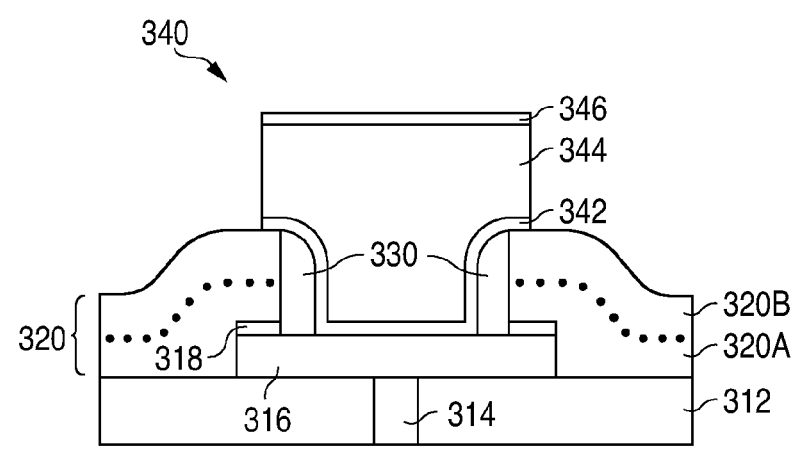

Alternately, a copper top can be formed on the top surface of the bond pad 316 before a bonding wire or a solder ball is attached. As shown in FIG. 9, after the side wall spacer 330 has been formed, a copper topped structure 340 is conventionally formed to touch the top surface of bond pad 316. The copper topped structure 340 includes, for example, a seed layer 342, an electroplated copper structure 344 that touches the top surface of the seed layer 342, and a bonding layer 346 that touches the top surface of the copper structure 344. The bonding layer 346, which allows bonding wires or solder balls to be conventionally attached, can be implemented with, for example, cobalt or nickel.

Figure 10:
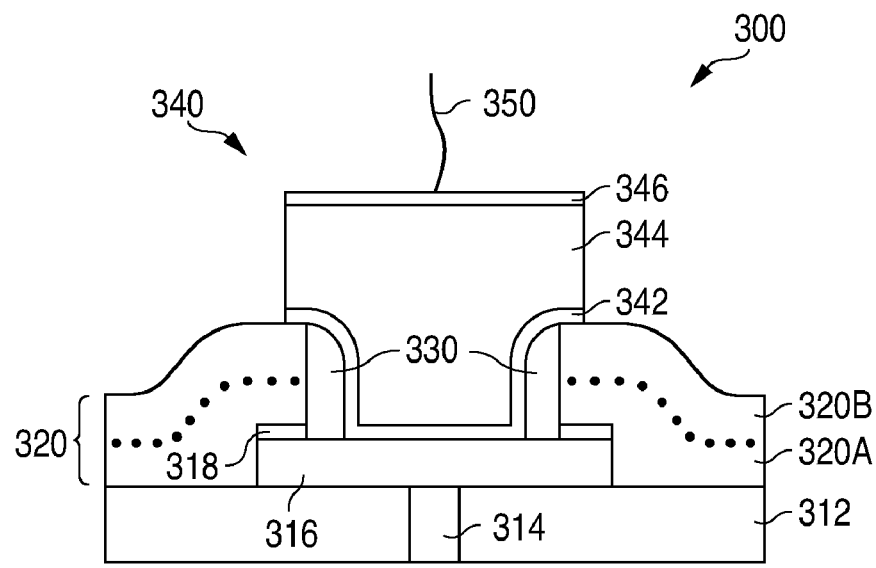
Figure 11:
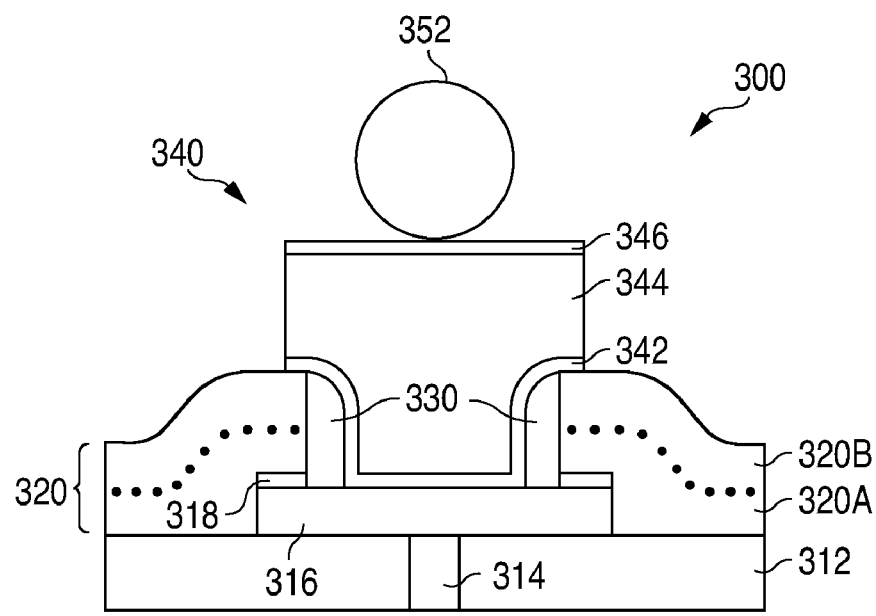

As shown in FIG. 10, after the copper topped structure 340 has been formed, the method completes the formation of the connected metal interconnect structure 300 by attaching a bonding wire 350 to the copper topped structure 340 in a conventional manner to make an electrical connection to a package or, alternately, as shown in FIG. 11, the method completes the formation of the connected metal interconnect structure 300 by attaching a solder ball 352 to the copper topped structure 340 in a conventional manner to make an electrical connection to, for example, a printed circuit board.

Thus, one of the advantages of the present invention is that the side wall spacer 330 covers and protects the exposed side wall of the ARC layer 318 from moisture and, as a result, protects the ARC layer 318 and the bond pad 316 from moisture and corrosion during reliability testing as well as during the end use application. A further advantage of the present invention is that the formation of the side wall spacer 330 does not require a masking step, and thus can be implemented for little additional cost.

It should be understood that the above descriptions are examples of the present invention, and that various alternatives of the invention described herein may be employed in practicing the invention. Therefore, it is intended that the following claims define the scope of the invention and that structures and methods within the scope of these claims and their equivalents be covered thereby.

What is claimed is:

1. A method for preventing metal corrosion on a bond pad of an integrated circuit device, the method comprising the steps of: applying an anti-reflective coating layer to the bond pad; depositing a passivation layer over the anti-reflective coating layer and etching an aperture through the passivation layer and the anti-reflective coating layers down to the bond pad, the anti-reflective coating layer aperture having an upper edge, a lower edge, and a sidewall surface extending between the upper edge and the lower edge, the sidewall surface formed during formation of the anti-reflective coating layer aperture and the passivation layer aperture having an upper edge, a lower edge, and a sidewall surface extending between the upper edge and the lower edge, the sidewall surface formed during formation of the passivation layer coating layer aperture; depositing a conformal protective layer to touch the top surface of the passivation layer and line the aperture opening to touch the side wall of the passivation layer, the side wall of the anti-reflective layer and the top surface of the bond pad; and anisotropically etching the conformal protective layer until the center region of the bond pad is exposed, wherein the etching leaves a protective sidewall spacer that covers (i) the sidewall surface of the anti-reflective coating layer aperture, (ii) the sidewall surface of the of the passivation coating layer and (iii) a portion of the bond pad, wherein the side wall spacer has a lower width that is substantially larger than an upper width.

2. The method of claim 1, wherein the etching comprises: performing a mask and etch process to etch a bond pad opening through the passivation layer the anti-reflective coating down to the bond pad.

3. The method of claim 1, wherein the conformal protective layer is from a group that includes nitride, oxynitride, and oxide.

4. The method of claim 1, wherein the side wall spacer protects the sidewall surfaces of the anti-reflective coating layer aperture and the sidewall surfaces of the passivation coating layer from at least one of: a high temperature and a high humidity of the ambient atmosphere associated with subsequent assembly operations of the integrated circuit device.

5. The method of claim 1, wherein the side wall spacer protects the sidewall surface of the anti-reflective and the passivation layer aperture from corrosive materials used in subsequent assembly operations of the integrated circuit device.

6. The method of claim 1, wherein the side wall spacer prevents corrosion of the anti-reflecting coating layer.

7. The method of claim 1, wherein the anti-reflecting coating layer comprises at least one of: titanium nitride, titanium tungsten, titanium tungsten or tantalum nitride.

8. A method for preventing metal corrosion on a bond pad of an integrated circuit device, the method comprising the steps of: applying an anti-reflective coating layer to a the bond pad; depositing a passivation layer over the anti-reflective coating layer; performing a mask and etch process to remove a portion of the anti-reflective coating layer and the passivation layer to create an anti-reflective coating layer aperture and a passivation layer coating layer aperture through the anti-reflective layer and the passivation coatings down to the bond pad, the anti-reflective coating layer aperture having an upper edge, a lower edge and a sidewall surface extending between the upper edge and the lower edge, and the passivation layer aperture having an upper edge, a lower edge, and a sidewall surface extending between the upper edge and the lower edge, the sidewall surface formed during formation of the anti-reflective coating layer and passivation coating layer aperture; depositing a conformal protective layer to touch the top surface of the passivation layer and line the aperture opening to touch the side wall of the passivation layer, the side wall of the anti-reflective layer and the top surface of the bond pad, to seat the sidewall surface of the anti-reflective coating layer aperture and the passivation layer aperture from an ambient atmosphere; and etching an opening through the conformal protective layer down to the bond pad, wherein the etching removes portions of the conformal protective layer that touches the top surface of the bond pad and leaves portions of the conformal protective layer that cover (i) the sidewall surface of the anti-reflective coating layer aperture, (ii) the sidewall surface of the passivation coating layer, and (iii) portions of the bond pad, wherein the remaining conformal protective layer has a lower width that is substantially larger than an upper width.

9. The method of claim 8, wherein the remaining conformal protective layer prevents corrosion of the anti-reflecting coating layer.

10. The method of claim 8, wherein the etching comprises: performing a second mask and etch process to etch a bond pad opening through the conformal protective layer down to the bond pad.

11. The method of claim 8, wherein the bond pad comprises at least one of: aluminum, aluminum silicon, aluminum copper, or aluminum silicon copper.

12. The method of claim 8, wherein the conformal protective layer protects the sidewall surface of the anti-reflective and the passivation coating layers aperture from at least one of: a high temperature and a high humidity of the ambient atmosphere associated with subsequent assembly operations of the integrated circuit device.

13. The method of claim 8, wherein the conformal protective layer protects the sidewall surface of the anti-reflective coating and the passivation coating layers aperture from corrosive materials used in subsequent assembly operations of the integrated circuit device.

14. The method of claim 8, wherein the anti-reflecting coating layer comprises at least one of: titanium nitride, titanium tungsten, titanium tungsten or tantalum nitride 15. A method for preventing metal corrosion on a bond pad of an integrated circuit device, the method comprising the steps of: forming an anti-reflective coating layer over a metal bond pad and a passivation layer over the anti-reflective coating layer, the anti-reflective coating and the passivation layer having an aperture through the anti-reflective coating layer and the passivation layer down to the bond pad, the anti-reflective coating layer aperture having an upper edge, a lower edge, and a sidewall surface extending between the upper edge and the lower edge and the passivation coating layer an aperture having an upper edge, a lower edge, and a sidewall surface extending between the upper edge and the lower edge; depositing a conformal protective layer over the anti-reflective coating layer and directly over the passivation layer to seal the sidewall surfaces of the anti-reflective coating layer and the passivation layer apertures from an ambient atmosphere; and etching an opening through the conformal protective layer down to the bond pad, wherein the etching removes portions of the conformal protective layer that touches the top surface of the bond pad and leaves portions of the conformal protective layer that cover (i) the sidewall surface of the anti-reflective coating layer aperture, (ii) the sidewall surface of the passivation coating layer aperture, and (iii) portions of the bond pad.

16. The method of claim 15, wherein the conformal protective layer prevents corrosion of the anti-reflecting coating layer.

17. The method of claim 15, wherein the etching comprises: performing a mask and etch process to etch a bond pad opening through the conformal protective layer down to the bond pad.

18. The method of claim 15, wherein the bond pad comprises at least one of: aluminum, aluminum silicon, aluminum copper, or aluminum silicon copper.

19. The method of claim 15, wherein the conformal protective layer protects the sidewall surface of the anti-reflective coating and the passivation layer apertures from at least one of: a high temperature and a high humidity of the ambient atmosphere associated with subsequent assembly operations of the integrated circuit device.

20. The method of claim 15, wherein the anti-reflecting coating layer comprises at least one of: titanium nitride, titanium tungsten, titanium tungsten or tantalum nitride.

* * * * *